(12) United States Patent
Tan et al.

(10) Patent No.: US 7,994,608 B2
(45) Date of Patent: Aug. 9, 2011

(54) MAGNETICALLY ALIGNABLE INTEGRATED CIRCUIT DEVICE

(75) Inventors: Ai Min Tan, Dunbar Walk (SG); Gerald Ofner, Regensburg (DE); Swain Hong Yeo, Singapore (SG); Mary Teo, Singapore (SG); Pei Siang Lim, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 590 days.

(21) Appl. No.: 11/996,604

(22) PCT Filed: Aug. 24, 2005

(86) PCT No.: PCT/IB2005/002513
§ 371 (c)(1),
(2), (4) Date: Jun. 5, 2008

(87) PCT Pub. No.: WO2007/023327
PCT Pub. Date: Mar. 1, 2007

(65) Prior Publication Data
US 2008/0265367 A1 Oct. 30, 2008

(51) Int. Cl.
*H01L 21/00* (2006.01)
*H01L 23/58* (2006.01)
(52) U.S. Cl. ............... 257/531; 438/108; 257/E21.022; 257/E21.499; 257/E23.003
(58) Field of Classification Search .................. 257/531, 257/797, E21.022, E21.499, E23.003; 361/820
See application file for complete search history.

(56) References Cited

U.S. PATENT DOCUMENTS

| 3,960,279 | A | 6/1976 | Hartleroad et al. |
| 5,986,348 | A | 11/1999 | Fukano |
| 6,005,281 | A | * 12/1999 | Conboy et al. ............... 257/531 |
| 6,049,974 | A | 4/2000 | Asanasavest |
| 6,486,534 | B1 | 11/2002 | Sridharan et al. |
| 2006/0022784 | A1* | 2/2006 | Kopp ........................... 336/100 |

FOREIGN PATENT DOCUMENTS

| GB | 1299541 | 1/1970 |
| JP | 01191422 | 12/1991 |
| JP | 5315402 | 11/1993 |
| JP | 918197 | 1/1997 |
| JP | 10112477 | 4/1998 |
| JP | 11266076 | 9/1999 |
| JP | 200526481 | 1/2005 |

* cited by examiner

*Primary Examiner* — Evan Pert
(74) *Attorney, Agent, or Firm* — Dicke, Billig & Czaja, PLLC

(57) ABSTRACT

An integrated circuit device includes a semiconductor chip having an active surface with a plurality of chip contact pads, a rewiring substrate and an electrically conductive inductor coil for magnetically aligning the semiconductor chip with the rewiring substrate.

25 Claims, 6 Drawing Sheets

MAGNETICALLY ALIGNABLE INTEGRATED CIRCUIT DEVICE

CROSS-REFERENCE TO RELATED APPLICATIONS

This Utility Patent Application is a National Filing under 35 U.S.C. 371 of International Application PCT/IB2005/002513, filed Aug. 24, 2005, incorporated herein by reference.

BACKGROUND

This disclosure relates to a magnetically alignable semiconductor chip and a rewiring substrate and a method for magnetically aligning the semiconductor chip and the rewiring substrate.

Semiconductor packages in which the semiconductor chip is mounted on a rewiring substrate by flip-chip contacts, such as solder balls or solder bumps, have the advantage that the electrical contact between the semiconductor chip and the rewiring substrate can be provided for all of the contacts essentially simultaneously in a single solder reflow process. Thus, the electrical connection can be provided more quickly than by a bond wire process in which the bond wire contacts are produced serially. Flip-chip contacts also have the advantage that the contacts can be provided at the wafer level which increases productivity and simplifies the manufacturing process.

However, it is necessary to accurately align the flip-chip contacts with the contact pads of the rewiring substrate in order to ensure a good electrical contact and avoid shorts between neighbouring contacts. This is normally achieved by optical or mechanical alignment methods although magnetic alignment methods, as are known from U.S. Pat. No. 6,049,974, are also known.

These alignment methods have the disadvantage that the accuracy of the alignment is limited. Insufficiently accurate alignment is increasingly a problem as the pitch between the chip contact pads and, therefore, the flip-chip contacts is increasingly being reduced.

SUMMARY

A semiconductor chip includes an active surface with integrated circuit devices and a plurality of chip contact pads. The semiconductor chip further includes at least one first alignment device for magnetically aligning the semiconductor chip with a rewiring substrate of a semiconductor package. The first alignment device includes an electrically conductive inductor coil which, typically includes a metal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
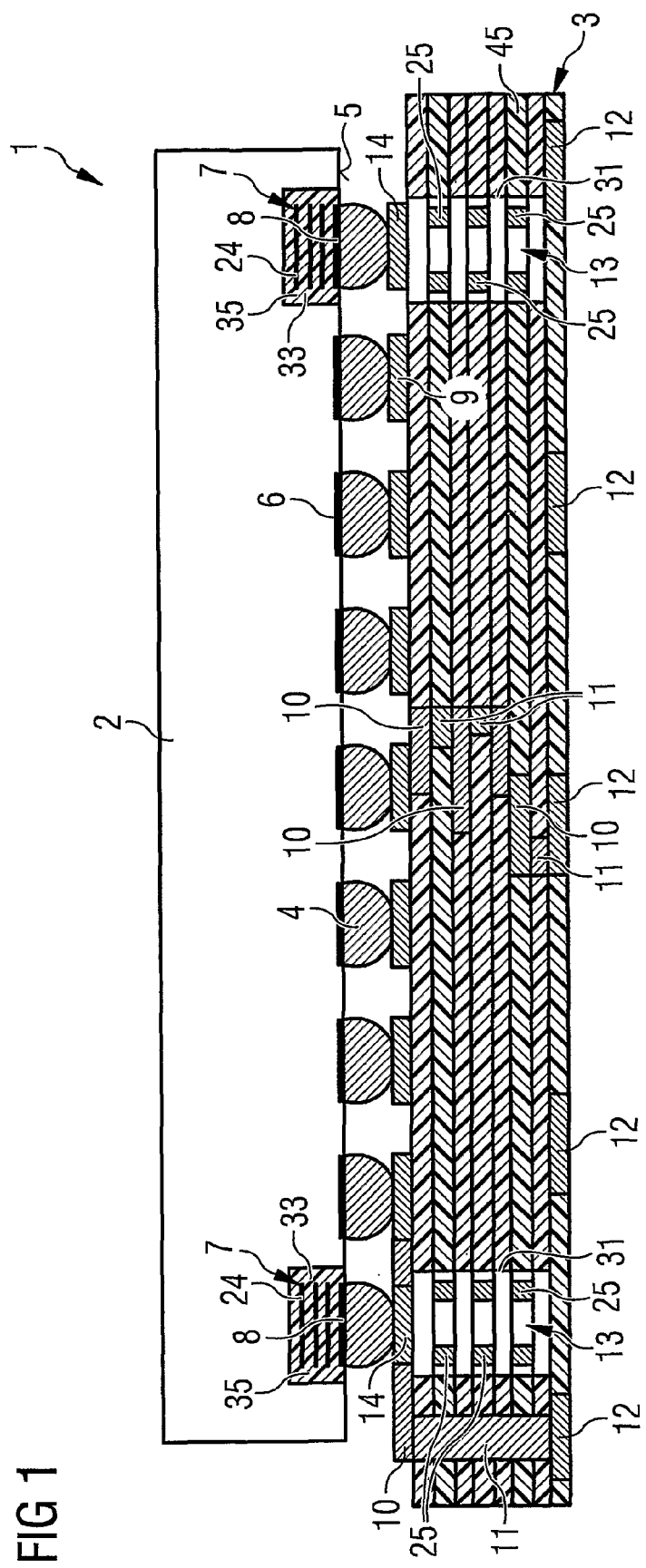
FIG. 1 illustrates a semiconductor package including an alignment system according to a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The semiconductor chip can be magnetically aligned with a rewiring substrate by inducing a magnetic field in the inductor coil. This magnetic field can be induced by applying a magnetic field to the inductor coil. Alternatively, a current may be applied to the inductor coil to generate a magnetic field. The magnetic field produced by the inductor coil of the semiconductor chip can interact with a magnetic field of opposing polarity produced by the rewiring substrate to provide an attractive force so that the semiconductor chip is magnetically aligned with the substrate.

Since the device for aligning the semiconductor chip is provided on the chip itself, the alignment accuracy is improved. In prior art methods in which the magnetic field is produced by the chip holder, the magnetic alignment, therefore, occurs between the chip holder and the substrate holder. The alignment accuracy is, therefore, influenced by the accuracy of the placement of the chip on the chip holder. If the semiconductor chip is inaccurately placed on the chip holder, then this inaccuracy can be transferred to the alignment of the chip on the substrate. This problem is avoided by providing the means for magnetically aligning the semiconductor chip directly on the chip itself.

The use of an electrically conductive inductor coil has an advantage over the use of magnetic material such as ferromagnetic material as the electrical properties of the semiconductor chip and, therefore, its functionality are not influenced by the magnetic field. Therefore, the advantages of providing the magnetic alignment means on the chip directly can be used without the disadvantages associated with the effect of a magnetic material on the functionality of the chip.

The first alignment device can be disposed within the body of the semiconductor chip or on the active surface of the semiconductor chip. By placing the inductor coil in the body of the semiconductor chip, space can be saved on the active surface of the chip. By placing the inductor coil on the active surface of the semiconductor chip, the fabrication process required to produce the inductor coil is simplified.

The first alignment device may be located underneath an alignment chip contact pad. This has the advantage that the accuracy of the alignment is improved as the magnetic field is produced essentially at the point, i.e. the flip-chip contact disposed on the chip pad, which should be aligned with the rewiring substrate. Also space on the active surface of the substrate is not occupied by the inductor coil.

The plurality of chip contact pads are typically arranged in an array of rows and columns on the active surface of the semiconductor chips with flip-chip contacts. The first alignment device can be positioned at a corner of the array. This has the advantage that space on the active surface of the chip can be better used as, generally, the corner of the chip includes fewer or even no integrated circuit devices. Alternatively, the first alignment device may be positioned towards the centre of the array.

The semiconductor chip includes, in an embodiment, two first alignment devices. Two alignment device have the advantage that the accuracy of the alignment is further improved as inaccuracies caused by the rotation of the chip about an axis perpendicular to the active surface can be avoided. The two first alignment devices may also each include an electrically conductive inductor coil which is located underneath an alignment chip contact pad. The two first alignment means may be positioned at two corners of the array. In a further embodiment, the semiconductor chip includes a number of inductor coils, the number being at least two but less than the total number of flip-chip contacts.

In an embodiment, the first alignment device has approximately the same lateral size as the alignment chip contact pad. This has the advantage that the magnetic field is produced in close proximity to the flip chip contact which improves the accuracy of alignment. Also, the space occupied by the inductor coil is reduced so that a high density of integrated circuit elements can be provided.

In an embodiment, the first alignment device includes a solenoid coil. Alternatively, the first alignment device includes at least one ring. A solenoid or helical coil has the advantage that it can be further provided with an input and output end and a current can be applied to the coil to generate a local magnetic field. A ring inductor coil has the advantage that it is simple to fabricate by photolithographic techniques. The ring inductor coil can include two or more electrically isolated rings arranged in a vertical stack to increase the magnetic field.

The alignment chip contact pad may include magnetic material such as a ferromagnetic material. This has the advantage that a larger magnetic field can be induced which can further increase the accuracy of alignment if the frictional forces are larger. Similarly, the semiconductor chip may further include an alignment contact disposed on the alignment contact pad which includes magnetic material to further increase the magnetic field strength.

The invention also provides a rewiring substrate for a semiconductor package which can be used in conjunction with the semiconductor chip provided by the invention to produce a semiconductor package. The rewiring substrate includes a plurality of inner contact pads on its upper surface, a plurality of conductor tracks, a plurality of vias and a plurality of outer contact pads on its lower surface. According to the invention, the rewiring substrate further includes at least one second alignment device for magnetically aligning the rewiring substrate with a semiconductor chip of a semiconductor package. The second alignment device is disposed underneath an alignment contact pad which is positioned on the upper surface of the rewiring substrate or board.

The rewiring substrate may include an electrically insulating body such as glass fibre or a plastic and the rewiring structure provided by the conductor tracks, vias and inner and outer contact pads may include copper or a copper alloy. The contact pads may also further include a further contact layer which is wettable by solder.

As the second alignment device is disposed under the chip alignment pad in the body of the rewiring substrate, additional space is not required on the upper surface of the rewiring board to accommodate the alignment device. Therefore, the lateral size of the rewiring board and the package is not increased. Also, the alignment means is located in close proximity to the inner contact pad onto which the flip-chip contact is to be placed. This improves the accuracy of the alignment.

In an embodiment, the second alignment device includes an electrically conductive inductor coil. An inductor coil has the advantage that in normal operation, after the semiconductor chip is mounted and electrically connected to the substrate, no magnetic field is present. Therefore, the electrical functionality and performance of the package is not influenced by an additional magnetic field. The inductor coil can be produced by an induced magnetic field by applying an external magnetic field to the inductor coil. Alternatively, an electric current may be applied directly to the inductor coil to generate a magnetic field.

The second alignment device can be disposed within the body of the substrate or on the upper surface of the rewiring substrate. In an embodiment, the second alignment device is approximately the same lateral size as the substrate alignment pad. This arrangement provides a localised magnetic field in close proximity to the position which is to be aligned. Therefore, the contact pad can be more accurately aligned with the flipchip contact of the semiconductor chip. The errors associated with the physical positioning of the rewiring substrate on a holder which produces a magnetic field for magnetically alignment.

In an embodiment, the second alignment device includes a solenoid or helical coil. Alternatively, the second alignment device includes at least planar one ring. A solenoid or helical coil has the advantage that an electric current can be applied and a magnetic field produced to provide a localised magnetic alignment field. A coil including at least planar one ring has the advantage that it is simple to produce. A number of planar rings may be provided. The planar rings may be vertically concentrically stacked one on top of the other to form an inductor coil which is capable of generating a magnetic field. The larger the number of rings, or in the case of a solenoid coil, the larger the number of turns, the larger the magnetic field which can be generated. Therefore, the number of rings or turns may be chosen to produce the desired magnetic field strength.

The second alignment device can include magnetic material. The magnetic material may also be provided as a core in the center of an inductor coil to increase the strength of the magnetic field. This is useful if higher frictional forces are to be overcome.

Embodiments of the invention also provides a semiconductor package which includes the semiconductor chip according to one of the embodiments previously described and the rewiring substrate according to one of the embodiments already described. The semiconductor chip is electrically and mechanically connected by flip chip contacts which are disposed on the chip contact pads to the inner contact pads of the rewiring substrate. The lateral arrangement of the inner contact pads, therefore, corresponds to the lateral arrangement of the chip contact pads on the active surface of the chip. The first alignment device of the semiconductor chip is, therefore, essentially vertically aligned with the second alignment device of the rewiring substrate.

The invention also provides methods to align a semiconductor chip with a rewiring substrate. A substrate holder is provided which includes a first electromagnet. The electromagnet can include an electrically conductive coil which can be connected to an external power supply. The external supply is an ac current supply. A chip holder is also provided which includes a second electromagnet. The second electromagnet can include an electrically conductive coil which can be connected to a second external power supply which is an ac current supply. A semiconductor chip and rewiring substrate according to one of the embodiments previously described are provided. Flip-chip contacts such as solder bumps or solder balls are positioned on the plurality of chip contact pads.

The rear side of the rewiring substrate is detachedly mounted on the substrate holder. Depending on the configuration used, this may be achieved by simply using the effect of gravity if the substrate holder lies horizontally and the rewiring substrate is played on its upper surface. The rear surface of the semiconductor chip is detachedly mounted on the chip holder. This can be performed using a vacuum suction type chip holder.

The semiconductor chip is then positioned above the substrate so that the active surface of the semiconductor chip faces the upper surface of the rewiring substrate. The plurality of chip contacts pads are then approximately laterally aligned with the plurality of inner contact pads of the rewiring substrate.

A first magnetic field is then produced in the first alignment using the semiconductor chip. The first magnetic field has a polarity. A second magnetic field of opposing polarity is produced in the second alignment using the rewiring substrate. The semiconductor chip is magnetically aligned with the substrate due to the attraction between the two magnetic fields of opposing polarities. The chip holder and the substrate holder are then removed.

In an embodiment, the electric current applied to the first electromagnet of the substrate holder has a phase shift with respect to the electric current applied to the second electromagnet of the chip holder. The phase shift may be adjusted such that the polarity of the first magnetic field produced in the first alignment device of the semiconductor chip opposes the polarity of the second magnetic field produced in the second alignment device of the rewiring substrate. This produces an attractive force between the two magnetic fields which enables the semiconductor chip to be accurately aligned with the rewiring substrate.

Since the magnetic fields are produced by means disposed on or in the semiconductor chip and substrate respectively, inaccuracy due to incorrect physical alignment of the semiconductor chip on the chip holder and/or of the substrate on the substrate holder is avoided.

According to the invention, conventional optical means are used to approximately align the semiconductor chip with the substrate. During this stage of the method, the silicon chip is held by a vacuum on the bonding head of the chip bonder. The magnetic field is already provided by the electromagnet in the chip bonder and in the holder. However, as the chip holder secures the semiconductor chip by vacuum, the semiconductor chip is not able to move and follow the magnetically induced forces.

The semiconductor chip is then placed in close proximity to its final position on the rewiring substrate. At this time, the vacuum is switched off, releasing the semiconductor chip while the magnetic field is maintained. The fine alignment of the semiconductor chip and rewiring substrate is then carried out by magnetic forces.

In a first embodiment, after the vacuum is switched off, and the semiconductor chip released from the chip bonder, the bonding head of the chip bonder remains in close proximity to the rear side of the semiconductor chip so that the magnetic fields are maintained.

In a further embodiment, the chip bonder is removed further away from the semiconductor chip. Due to hysteresis effects in the alignment contact pads, the semiconductor chip is aligned with the substrate.

In a further embodiment, the magnetic field of only the substrate holder is used. This embodiment, it is suitable when the alignment contact pads and/or the flip-chip contact include magnetic material, such as a ferromagnetic material, as the inherent magnetic properties of the material provide sufficient interaction with the alternating magnetic field of the substrate carrier.

The electric current which flows through the coil of the electromagnet of the substrate holder and through the coil of the electromagnet of the chip holder have a phase shift. The phase shift is chosen so that the first alignment device of the semiconductor chip has, for example, a magnetic north Pole when the second alignment device of the substrate is a magnetic south Pole and vice versa.

In an embodiment, the inductor coil providing the first alignment device of the semiconductor chip is fabricated by photolithographic techniques. A structured metal layer which forms a portion of the inductor coil is deposited. A dielectric layer is then deposited on top and a further structured metal layer deposited. These processes are repeated to build up the inductor coil.

Photolithographic techniques have the advantage that they are well known for producing multi-layer metal/dielectric structures for semiconductor chips. Therefore, a metal inductor coil can be reliably and accurately built up by depositing and structuring a series of dielectric and metal layers using similar techniques. Photolithographic techniques also have the advantage that fine structures can be reliably and accurately produced.

The invention also provides a method to assemble a semiconductor package. A semiconductor chip according to one of the embodiments previously described which is aligned with the substrate according to one of the embodiments previously described is provided. The semiconductor chip is then electrically and mechanically connected with the substrate by performing a solder reflow heat treatment. The solder reflow treatment melts the flip-chip contacts and produces a solder bond between each chip contact pad and an inner contact pad.

Underfill material is then applied to the space between the semiconductor chip and substrate and the semiconductor chip encapsulated in plastic mold material to produce a semiconductor package.

The invention, therefore, provides an improved method of achieving accurate alignment of flip-chip bumps on to corresponding substrate terminals, and is especially suitable for bump pitches of less than 150 μm. Since the two magnetic forces are used for self alignment between specific flip-chip bumps and corresponding substrate pads, the problems associated with the existing optical and mechanical means are avoided. Therefore, the limitations associated with equipment capability, stringent substrate specifications and the consequent reduced productivity are avoided.

With the semiconductor chip and substrate of the invention, fine alignment is achievable down to the feature size due to the specific alignment between the designated alignment bumps and pads. Accurate placement is possible which is independent of equipment and external alignment systems since the fine alignment make mechanism is now built within the chip and the substrate. The productivity of the flip-chip attach process is improved, since the very precise and slow mechanical placement method currently used is not necessary.

FIG. 1 illustrates an integrated circuit, or a semiconductor package 1 according to a first embodiment of the invention. The semiconductor package 1 includes a semiconductor chip 2 mounted on a rewiring substrate 3 by a plurality of flip chip contact bumps 4.

The semiconductor chip 2 includes an active surface 5 with integrated circuit devices and a plurality of chip contact pads 6 which are laterally arranged in rows and columns in a square grid array. The lateral arrangement of the chip contact pads 6 cannot be seen in the cross-sectional view of FIG. 1. A solder ball 4, which includes the flip chip bump 4, is attached to each of the plurality of chip contact pads 6 and provides the electrical connection to the integrated circuits.

According to embodiments of the invention, the semiconductor chip 2 further includes a plurality of first metal coils 7 which are disposed in the body of the semiconductor chip 2.

It should be noted that the FIGS. 1 to 8 are not drawn to scale and, in particular, the size of the metal coils and the means for magnetic alignment is exaggerated in order to more clearly illustrate the invention. The same reference numbers are used to indicate the same features throughout the description of the figures.

In this first embodiment of the invention, the first metal coil 7 includes three essentially identical planar metal rings 24 which are vertically concentrically stacked and which are not in contact with one another. The metal coils 7 are built up by multiple masking and deposition processes using known photolithographic techniques to produce metal rings 24 which are separated and electrically isolated from each other by a dielectric layer 33. The series of dielectric layers 33 are not illustrated in FIG. 1 for clarity. In this embodiment of the invention, the metal coils 7 are built up in a closed-end via or recess 35 which was previously formed in the active surface 5 of the semiconductor chip 2. The closed end via 35 was formed by an etching technique. The production of a multiple layer metal coil using photolithographic techniques is described later in more detail with respect to FIG. 8.

In the embodiment of the invention illustrated in FIG. 1, a first coil 7 is located underneath each of the contact pads 8 positioned at the corners of the square grid array of chip contact pads 6. However, in another embodiment, not illustrated here, the coil 7 is located in a central part of the grid array of contact pads 6. The first coils 7 are not in contact with the corner chip pad 8. In the cross-sectional view of FIG. 1, the two outermost contact pads 6 are the corner chip pads 8 of the square grid array. The semiconductor chip 2, therefore, includes four first metal coils 7. The metal rings 24 of the first coil 7 are laterally approximately the same size as the corner contact pad 8.

The semiconductor chip 2 is mounted and electrically connected to a rewiring substrate 3 by the solder balls which provide the flip-chip bumps 4.

The rewiring substrate 3 includes a plurality of inner contact pads 9 positioned on its upper surface. The lateral arrangement of the inner contact pads 9 corresponds to the lateral arrangement of the chip contact pads 6. A flip chip bump 4 is, therefore, disposed between each of the chip contact pads 6 and inner contact pads 9 of the substrate.

The rewiring substrate 3 further includes a plurality of conductor tracks 10, a plurality of electrically conducting vias 11 disposed through its thickness and a plurality of outer contact pads 12 positioned on its bottom surface. The conductor tracks 10 and conducting vias 11 electrically connect the outer contact pads 12 to the inner contact pads 9 and provide the rewiring structure of the rewiring substrate 3.

In the embodiment of FIG. 1, the rewiring substrate 3 is a multi-layer substrate which includes seven dielectric layers 45. The dielectric layers 45 may include a material such as BT or FR4 depending on the application and type of semiconductor package. The rewiring substrate 3 is fabricated by stacking the dielectric layers 45 together. The intermediate dielectric layers 45 also include conductor tracks 10 and vias 11 which electrically connect the inner contact pads 9 and conductor tracks 10 on the upper surface of the rewiring substrate 3 with the outer contact areas 12 disposed on the lower surface of the rewiring substrate 3.

The rewiring substrate 3 further includes a plurality of second metal coils 13 positioned in the body of the substrate 3. A second metal coil 13 is positioned underneath each of the inner contact pad 14 located at the corner of the square grid array of inner contact pads 9. The second coil 13 includes three metal rings 25 which are vertically concentrically stacked. The three rings 25 are sandwiched between the dielectric layers 45 of the rewiring substrate and are, therefore, separated by dielectric layers 45 of the rewiring substrate 3 so that the three metal rings 25 are not in contact with each other or with the contact pad 14. The metal rings 25 are laterally approximately the same size as the contact pad 14. Therefore, the respective second metal coils 13 in the substrate 3 and first metal coils 7 positioned in the semiconductor chip 2 are essentially vertically aligned. The first metal coils 7 and the second metal coils 13 are able to function as inductor coils.

The space between the active surface 5 of the semiconductor chip 2 and the upper surface of the rewiring substrate 3 is normally underfilled with plastic underfill material and the passive rear side and the side faces of the semiconductor chip are encapsulated by a plastic mold material. The encapsulation materials of the semiconductor package 1 are not illustrated in FIG. 1 for clarity.

Outer contacts, such as solder balls, are later positioned on the external contact pads 12 to enable to the semiconductor package 1 to be mounted onto and electrically connected to an external substrate such as a printed circuit board.

Figure 2:
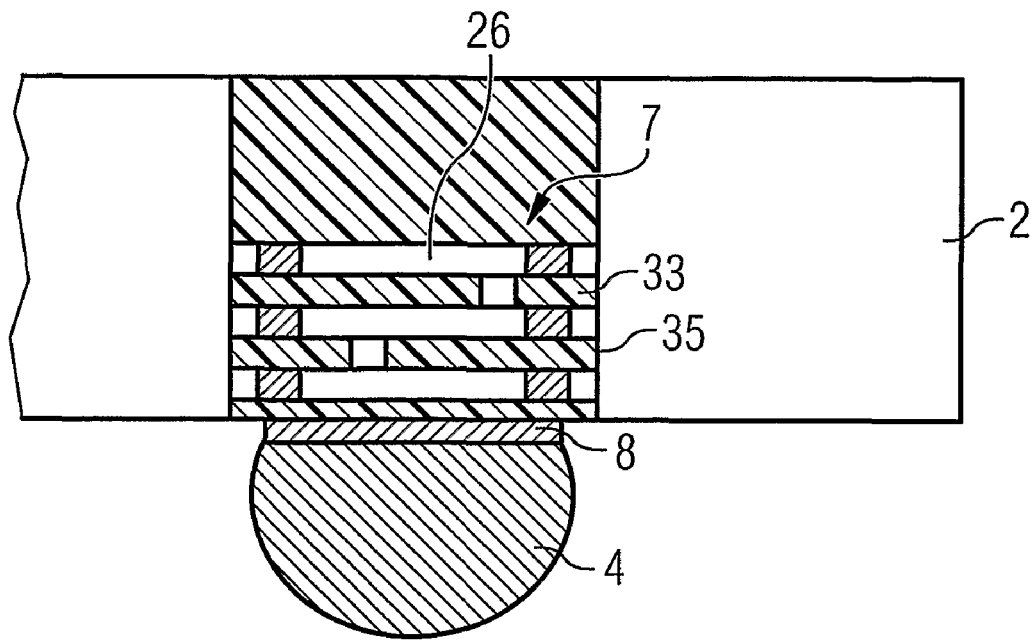
FIG. 2 illustrates a section of a semiconductor chip including an alignment means according to a second embodiment of the invention.

FIG. 2 illustrates a section of a semiconductor chip 2 including an alignment coil 7 according to a second embodiment of the invention. The first alignment coil 7 includes a continuous coil having a helical or solenoid form 26 with approximately three turns and provides an electrically-conductive inductor coil. The helical conductor 26 is disposed in a through-hole 35 which is disposed in the body of the semiconductor chip 2 and reaches from the active surface 5 to the opposing passive surface of the semiconductor chip. The helical coil 26 is laterally approximately the same size as the corner chip pad 8. The solenoid coil 26 is essentially laterally aligned with the corner contact pad 8 but is not in contact with the contact pad 8. The helical or solenoid coil 26 was fabricated by depositing and structuring multiple layers of metal and dielectric as is described in more detail later with reference to FIG. 8.

Figure 3:
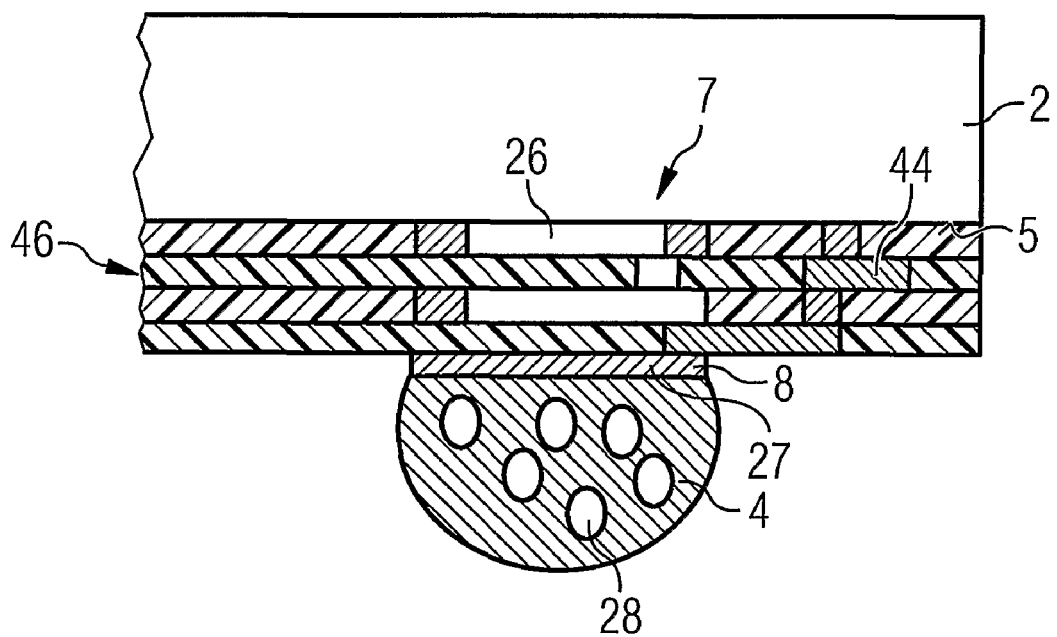
FIG. 3 illustrates a section of a semiconductor chip including an alignment means according to a third embodiment of the invention.

FIG. 3 illustrates a section of a semiconductor chip 2 according to a third embodiment of the invention. The first alignment coil 7 is a helical or solenoid coil 26 similar to that illustrated in FIG. 2. The alignment coil 7 was again built up by performing a series of masking, structuring and deposition processes. However, in contrast to FIG. 2, in this embodiment of the invention, the alignment coil 7 is disposed on the active surface 5 of the semiconductor chip 2. This arrangement has the advantage that the alignment coil 7 can be fabricated in the same manufacturing processes as the rewiring structure 46 which is formed on the active surface 5 of the semiconductor chip 2. The semiconductor chip 2 may have a thickness in the range of 200 μm to 700 μm and the total thickness of the rewiring layer 46 may be 20 μm to 200 μm. However, a rewiring layer 46 with a thickness of greater than 200 μm may also be deposited. This may be carried out in an inductor coil with a greater number of turns or coils is desired.

A coil 7 including vertically stacked electrically isolated planar metal rings, as illustrated in FIG. 2 for example, may also be provided on the active surface 5 of the semiconductor chip 2.

In a further embodiment of the invention, FIG. 3 illustrates that the corner contact pad 8 also includes a coating 27 of ferromagnetic material and the flip chip contact 4 also includes ferromagnetic material 28. The additional ferromagnetic material has the advantage of providing a stronger localised magnetic field which further improves the alignment of the semiconductor chip 2 and the rewiring substrate 3. Ferromagnetic pads and flip chip contacts including ferromagnetic material may also be provided in the embodiments of FIGS. 1 and 2 in which the alignment coil 7 is disposed in a via 35 within the body of the semiconductor chip 2.

Figure 4:
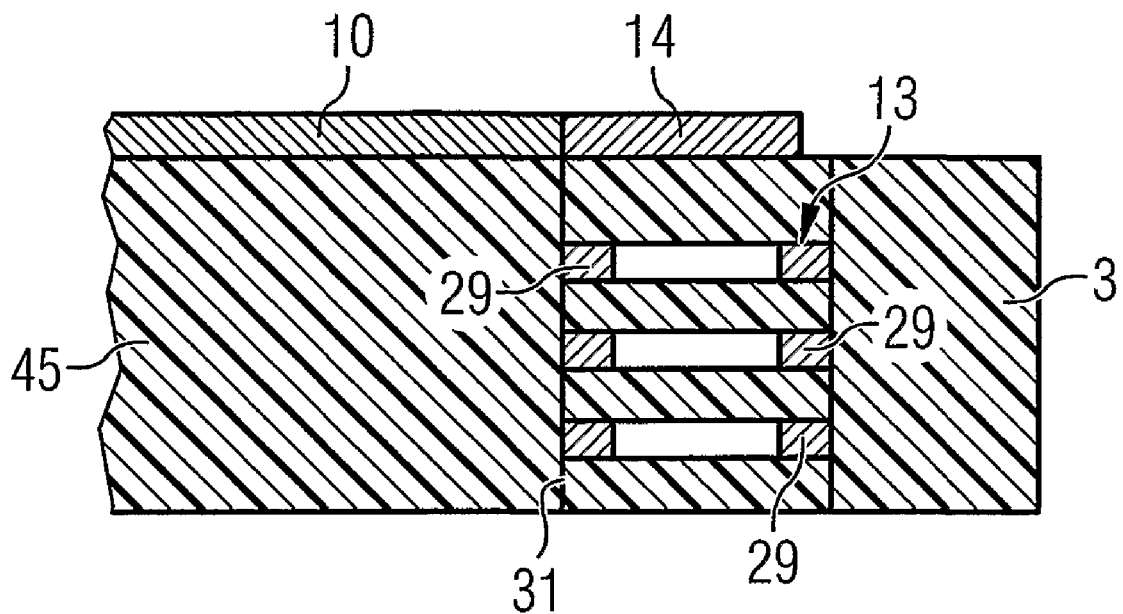
FIG. 4 illustrates a section of a rewiring substrate including an alignment means according to a fourth embodiment of the invention.

FIG. 4 illustrates a cross-sectional view of a section of a rewiring substrate 3 including a second alignment coil 13 according to a fourth embodiment of the invention. In this embodiment of the invention, the second alignment coil 13 includes planar rings 29 which form a coil 13. The coil 13 is disposed in a through-hole or via 31 in the body of the rewiring substrate 3 underneath the corner contact pad 14 and was fabricated by depositing a series of structured dielectric and metal layers, which are not illustrated in FIG. 4 for clarity, in the through-hole 31. The coil 29 is not in contact with the contact pad 14. In the embodiment of FIG. 4, the rewiring substrate 3 includes a single dielectric layer 45. The coil as illustrated in FIG. 4 may also, however, be provided in a multi-layer rewiring substrate 3 as illustrated in FIG. 1, for example.

Figure 5:
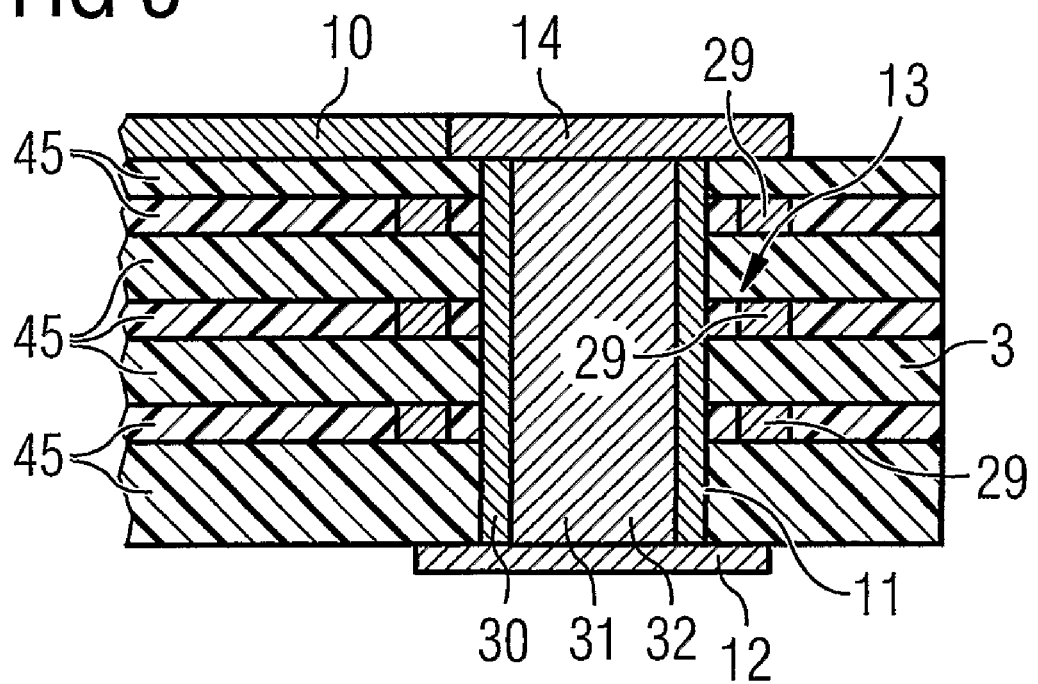
FIG. 5 illustrates a section of a rewiring substrate including an alignment means according to a fifth embodiment of the invention.

FIG. 5 illustrates a cross-sectional view of a section of a rewiring substrate 3 including an alignment device 13 according to a fifth embodiment of the invention.

The rewiring substrate 3 includes an alignment coil 13 including three planar metallic rings 29 which laterally surround a through-hole 31 which is filled with ferromagnetic material 32. The rewiring substrate 3 includes a series of dielectric layers 45 which are structured and stacked one on top of another to produce the planar metals rings 29, which are electrically isolated from one another by a dielectric layer 45, and a rewiring structure including conductor tracks 10 and vias 11 which are not illustrated in FIG. 5 for clarity.

In this fifth embodiment of the invention, a via 11 is disposed through the rewiring substrate 3 in approximately the lateral centre of each of the vertically stacked rings 29 which from the alignment coil 13. The via 11 electrically connects the corner contact pad 14 with an outer contact pad 12. The via also includes an electrically conducting coating or plating 30 on the walls of the through-hole 31 which forms the via 11. The through hole 31 is essentially filled with ferromagnetic material 32.

The arrangement illustrated in FIG. 5 may be produced by first producing the multilayer dielectric substrate 3 including the three planar rings 29 which form the alignment coil 13. A through-hole 31 is then drilled in approximately the lateral centre of the coil 13. The side walls of the through-hole 31 are then plated by a layer 30 of electrically conductive material and the through-hole 31 essentially filled with the ferromagnetic material 32.

Figure 6:
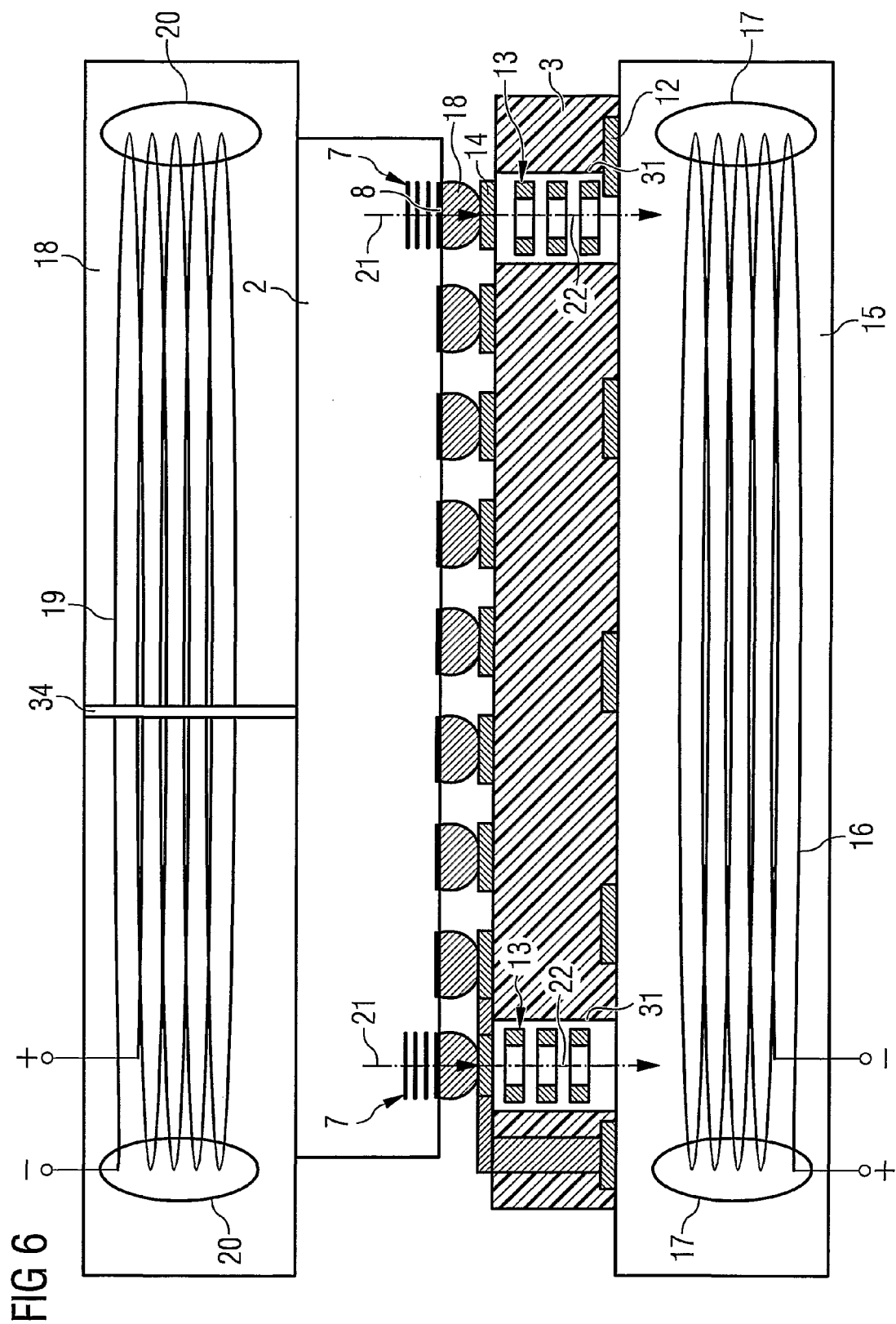
FIG. 6 illustrates a process in the method to assemble the semiconductor package of FIG. 1.

FIG. 6 illustrates a process in a method to align the semiconductor chip 2 with the rewiring substrate 3 according to the invention. The rear surface of the rewiring substrate 3 is detachedly attached to a substrate holder plate 15. The inner contact pads 9 of the rewiring substrate 3, therefore, face upwards. The substrate holder plate 15 includes a first solenoid coil 16. When an electrical current is supplied to the coil 16 a first magnetic field 17 is produced.

The semiconductor chip 2 is held by its passive rear surface on a flip chip bonder head 18 by vacuum suction 34 as is known in the art. The active surface 5 of the semiconductor chip 2 and the plurality of flip-chip contacts 4 face downwards. The flip chip bonder head 18 includes a second solenoid coil 19 which, when an electric current is applied to the coil, produces a second magnetic field 20.

The semiconductor chip 2, while held on the flip-chip bonder head 18 by vacuum suction, is then brought into close proximity with the rewiring substrate 3. Optical means, as are known in the art, are used to approximately laterally align the semiconductor chip 2 with the rewiring substrate 3. Electric current is applied to the coil 16 in the substrate holder to produce a first magnetic field 17. Since the semiconductor chip 2 is held on the bond head 18 by vacuum, it remains unaffected by any magnetically induced force.

When the semiconductor chip 2 is in close proximity to its final position on the rewiring substrate 3, the vacuum is withdrawn so that the semiconductor chip 2 can be aligned by magnetic force.

According to the invention, the plurality of first coils 7 provide a magnetic field of a first polarity, which is indicated in FIG. 6 by the arrow 21 representing the magnetic vector. The plurality of second coils 13 provide a magnetic field of the opposing polarity, which is indicated in FIG. 6 by the arrow 22 representing the magnetic vector.

The electric currents applied to the coil 19 of the chip bonder 18 and the coil 16 of the substrate holder 15 have a phase shift such that the coil 7 of the semiconductor chip 2 has a first polarity, for example north, when the second coil 13 of the rewiring substrate 3 has an opposing polarity, for example south.

In the embodiment of the invention illustrated in FIG. 6, the alignment coils 13 are disposed in a through-hole 31 which is disposed in the rewiring board 3. The coils 13 may be produced by depositing a series of metallic and dielectric layers in the throughhole 31 as described in connection with FIG. 8. Alternatively, the coil 13 may be prefabricated, for example by winding a solenoid coil from a wire, and then placed in the through-hole 31.

The magnetic field 21 of the first coils 7, which are positioned in the semiconductor chip 2, is able to interact with the magnetic field 22 from the second coils 13 in the substrate so as to cause an attractive force and alignment of the flip chip bumps 23 disposed on the corner chip contact pads 8 with the corresponding respective corner inner contact pads 14 of the substrate 3.

However, the method of aligning the semiconductor chip 2 and the rewiring substrate 3, as illustrated with FIG. 6, is not limited to the specific embodiments of the coils 7 and 13 illustrated in FIG. 6. The embodiments of the coils 7 of the semiconductor chip as illustrated in FIGS. 1 to 3 or the embodiments of the coils 13 of the rewiring substrate 3 as illustrated in FIGS. 1, 4 and 5 can equally be used in the method of the invention.

Figure 7:
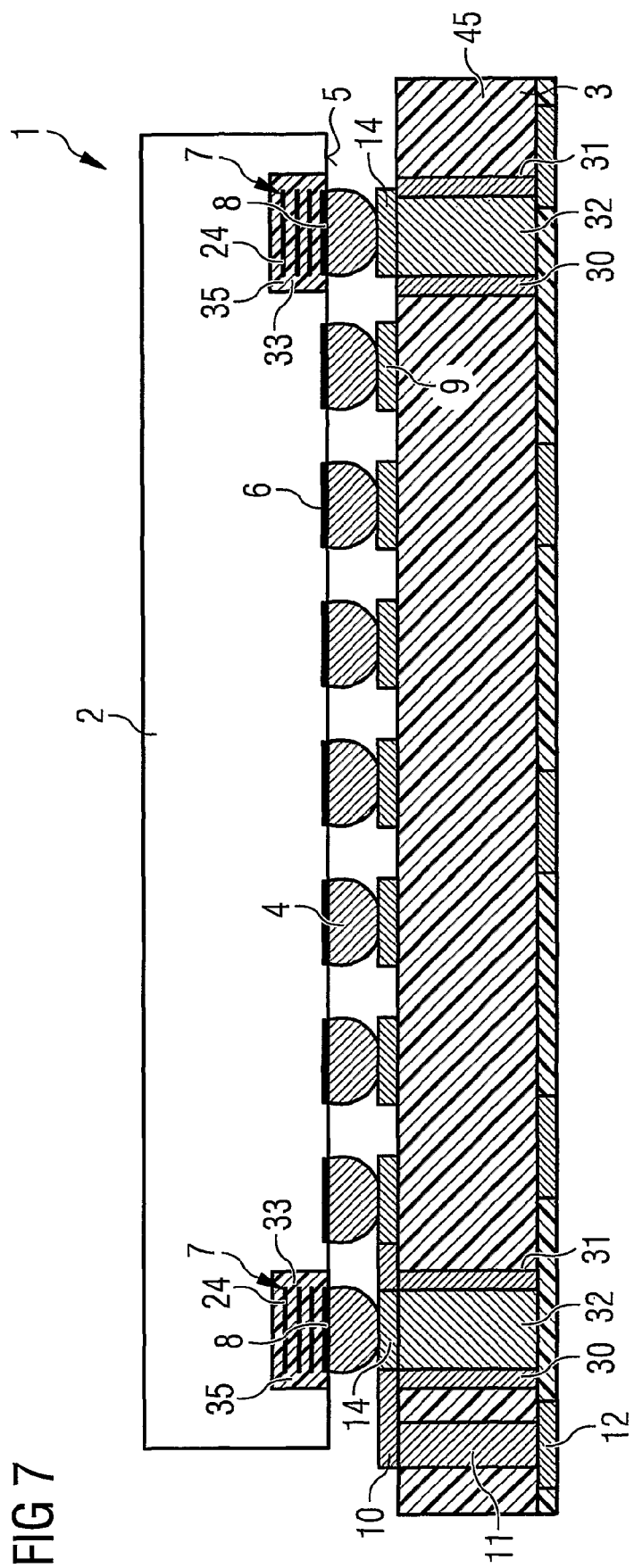
FIG. 7 illustrates a semiconductor package including an alignment system according to a sixth embodiment of the invention.

FIG. 7 illustrates a semiconductor package 1 including a semiconductor chip 2 and rewiring substrate 3 according to a sixth embodiment of the invention. In this embodiment, the rewiring substrate 3 includes a single dielectric layer 45. The magnetic alignment of the semiconductor chip 2 and rewiring substrate 3 is performed by providing through-holes 31 in the rewiring substrate 3. The side walls of through-holes 31 are plated by an electrically conductive layer 30 and the through-hole essentially filled with ferromagnetic material 32.

As in the other embodiments of the invention, the through-holes 31 are positioned in the rewiring substrate 3 so as to be approximately vertically aligned with the magnetic field producing coil 7 provided in the semiconductor chip 2. Although the coils 7 and the corresponding through-holes 31 are depicted as being disposed at two corners of the array of flip chip contacts 4, it is equally possible for them to be provided at any position within the lateral area of the package 1 occupied by the semiconductor chip 2.

The through-holes 31 are positioned so that the magnetic field produced by the ferromagnetic material produces an interactive force with the magnetic filed produced by the coils 7 in the semiconductor chip 2 so as to produce an attractive force between the semiconductor chip and the rewiring substrate 3 which laterally accurately aligns the flip chip contacts 4 with the corresponding inner contact pads 9 of the rewiring substrate 3.

FIG. 8 illustrates a helical or solenoid coil 16 which can be fabricated using photolithographic techniques. The helical coil 16 has three turns 36, 37, and 38 positioned one above the other. Each turn of the coil 16 is essentially planar and is mechanically and electrically attached to an adjacent turn by a vertical electrically conducting via 39, 42. In this embodiment of the invention, the lowest turn 36 also includes an input via 40 protruding from the lower surface and turn 38 includes an output via 41 protruding from its upper surface. Electric current can be applied to the input via, flow along the length of the coil 16 to the output via 41.

Figure 8A:
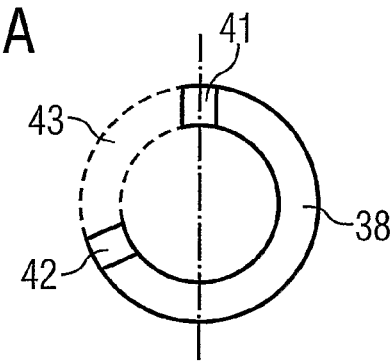
FIG. 8 illustrates the production of an alignment inductor coil by photolithographic techniques.
Figure 8B:
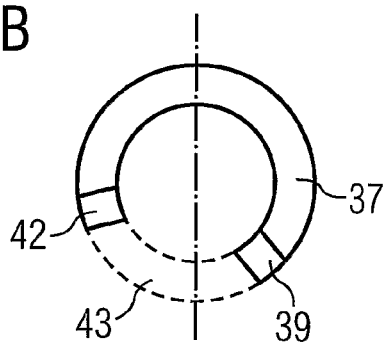
Figure 8C:
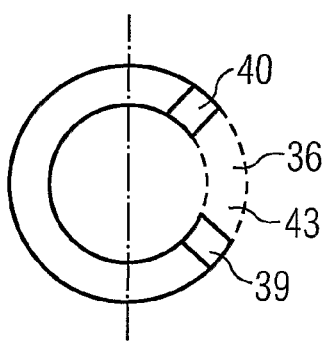
Figure 8D:
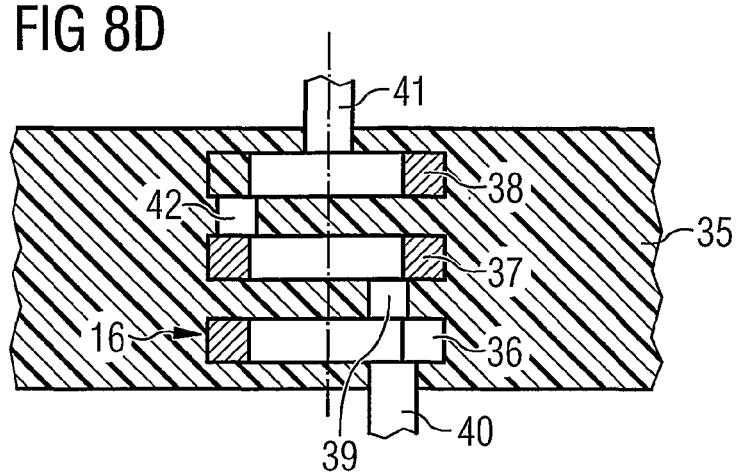

A cross-sectional view of the solenoid coil 16 is illustrated in FIG. 8d. FIG. 8a illustrates a plan view of the upper turn 38, FIG. 8b illustrates a plan view of the middle turn 37 and FIG. 8c illustrates a plan view of the lower turn 36 of the helix 16 which is illustrated in cross-section in FIG. 8d.

From the plan views of the three turns 36, 37, and 38, it can be seen that each turn of the helix is provided by an open metal ring, i.e. the metal ring includes a gap 43. As can be seen by comparing the position of the gaps 43 in each successive turn, the gap 43 is positioned in the adjacent turn with a clockwise rotation. The gap 43 is positioned in the middle turn 37 so that the input to the turn 37, which is indicated by the position of the vertical via 39, is vertically aligned with the output of the lower coil 36, as also indicated by the via 39. Similarly the output of the middle turn 37 is laterally vertically aligned with the input 42 of the upper turn 38. The gap 43 is positioned in the upper turn 38 with a clockwise rotation compared with the position of the gap 43 in the turn 37.

The helix 16 is, therefore, fabricated by sequentially depositing structured metal and dielectric layers which include the appropriate portion of the metal helix 16. Firstly, a structured metal layer with a metal first input via 40 is fabricated. A dielectric layer is then deposited and structure so that the upper surface of the via 40 is exposed. A further structured metal layer including a metal first turn 36 in the form of an open ring is fabricated so that the input end of the first turn 36 is electrically connected to the upper surface of the via 40. The helix 16 is further built up by depositing a further dielectric layer which is structured to include a metal first via 39. The first via 39 is positioned on the downstream or output end of the first turn 36.

A further structured dielectric/metal layer including a middle turn 37 is deposited so that the upstream or input end of the middle turn 37 is positioned vertically above and mechanically and electrically connected to the via 39. Similarly, a second via 42 is positioned on the downstream end of the middle turn 37. A third turn 38 is then deposited so that its upstream end is in electrical contact with the second via 42 and an output via 41 is deposited on the downstream end of the third turn 38.

A coil including two or more planar rings which are vertically concentrically stacked and separated by intermediate dielectric layers can be fabricated in a similar way as the solenoid coil of FIG. 8. In order to fabricate a coil including electrically isolated planar rings, the processes in which the via 39 and 40 are fabricated are simplified so that a closed dielectric layer is deposited on top of the metal ring formed on the lower layer.

Similarly, a solenoid coil without the input 40 and output via 41 can be fabricated by omitting the metal structure in these dielectric layers. The other processes, previously described, are performed to produce a solenoid coil without the input and output vias.

A helix or solenoid inductor coil 16 can, therefore, be fabricated using standard photolithographic techniques on the surface or in a closed-end via of a semiconductor chip or a rewiring substrate. The helix 16 provides an inductor coil for magnetically aligning the semiconductor chip and/or the rewiring substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An integrated circuit device, comprising:
a semiconductor chip including an active surface with a plurality of chip contact pads;
a rewiring substrate;
an electrically conductive inductor coil for magnetically aligning the semiconductor chip with the rewiring substrate, wherein the electrically conductive inductor coil is disposed within the body of the semiconductor chip.

2. The integrated circuit device of claim 1, wherein the electrically conductive inductor coil is disposed on an active surface of the semiconductor chip.

3. The integrated circuit device of claim 1, wherein the electrically conductive inductor coil is located underneath an alignment chip contact pad.

4. The integrated circuit device of claim 3, wherein the electrically conductive inductor coil has approximately the same lateral size as the alignment chip contact pad.

5. The integrated circuit device of claim 3, wherein the alignment chip contact pad comprises ferromagnetic material.

6. The integrated circuit device of claim 1, wherein the plurality of chip contact pads are arranged in an array of rows and columns and the electrically conductive inductor coil is positioned at a corner of the array.

7. The integrated circuit device of claim 1, wherein the electrically conductive inductor coil comprises a solenoid coil.

8. The integrated circuit device of claim 1, wherein the electrically conductive inductor coil comprises at least one ring.

9. An integrated circuit device, comprising:
a semiconductor chip including an active surface with a plurality of chip contact pads;
a rewiring substrate;
an electrically conductive inductor coil for magnetically aligning the semiconductor chip with the rewiring substrate, wherein the semiconductor chip includes an alignment contact disposed on an alignment contact pad which comprises ferromagnetic material.

10. An integrated circuit device, comprising:
a semiconductor chip including an active surface with a plurality of chip contact pads;
a rewiring substrate;
an electrically conductive inductor coil for magnetically aligning the semiconductor chip with the rewiring substrate, wherein the rewiring substrate includes:
an upper surface having a plurality of inner contact pads thereon;
a plurality of flip chip contacts electrically connecting the chip contact pads to the inner contact pads; and
a lower surface having a plurality of conductor tracks, a plurality of vias and a plurality of outer contact pads thereon.

11. The integrated circuit device of claim 10, wherein the rewiring substrate includes an electrically conductive inductor coil disposed underneath an alignment contact pad and vertically aligned with the electrically conductive coil of the semiconductor chip.

12. A rewiring substrate, comprising:
an upper surface having a plurality of inner contact pads thereon;
a lower surface having a plurality of conductor tracks, a plurality of vias and a plurality of outer contact pads thereon;
an electrically conductive inductor coil disposed underneath an alignment contact pad for magnetically aligning the rewiring substrate with a semiconductor chip of a semiconductor package.

13. The rewiring substrate of claim 12, wherein the electrically conductive inductor coil is disposed within the body of the substrate.

14. The rewiring substrate of claim 12, wherein the electrically conductive inductor coil is approximately the same lateral size as the alignment contact pad.

15. The rewiring substrate of claim 12, wherein the electrically conductive inductor coil comprises a solenoid coil.

16. The rewiring substrate of claim 12, wherein the electrically conductive inductor coil comprises at least one ring.

17. The rewiring substrate of claim 12 wherein the electrically conductive inductor coil comprises surrounds a magnetic material.

18. A method for assembling an integrated circuit device, comprising:
providing a semiconductor chip having a first conductive coil disposed within the body of the semiconductor chip;
providing a rewiring substrate having a second conductive coil;
creating first and second magnetic fields in the first and second conductive coils, respectively, to magnetically align the semiconductor chip and the rewiring substrate;
electrically connecting chip contact pads of the semiconductor chip with inner contact pads of the rewiring substrate by performing a solder reflow heat treatment;
applying an underfill material to a space between the semiconductor chip and the rewiring substrate; and
encapsulating the semiconductor chip in plastic mold material.

19. An integrated circuit device, comprising:
a semiconductor chip including an active surface with a plurality of chip contact pads;
a rewiring substrate;
an electrically conductive inductor coil for magnetically aligning the semiconductor chip with the rewiring substrate, wherein the electrically conductive inductor coil is located underneath an alignment chip contact pad.

20. The integrated circuit device of claim 19, including two of the electrically conductive inductor coils, each being located underneath an alignment chip contact pad, the two electrically conductive inductor coils being positioned at two corners of the array.

21. The integrated circuit device of claim 20, wherein the electrically conductive inductor coil is disposed within the body of the semiconductor chip.

22. A method to align a semiconductor chip with a rewiring substrate, the method comprising:
providing a substrate holder including a first electromagnet;
providing a chip holder including a second electromagnet;
detachedly mounting a rear side of a rewiring substrate on the substrate holder;
detachedly mounting a rear surface of a semiconductor chip on the chip holder;
positioning the semiconductor chip above the rewiring substrate so that an active surface of the semiconductor chip faces an upper surface of the rewiring substrate and approximately laterally aligning a plurality of chip contacts pads with a plurality of inner contact pads of the rewiring substrate;
producing a first magnetic field in a first conductive coil disposed within the semiconductor chip, wherein the first magnetic field has a polarity;
producing a second magnetic field of opposing polarity in a second conductive coil of the rewiring substrate;
magnetically aligning the semiconductor chip with the rewiring substrate; and
removing the chip holder and substrate holder.

23. The method of claim 22, wherein an electric current applied to the first electromagnet of the substrate holder has a phase shift with respect to an electric current applied to the second electromagnet of the chip holder.

24. The method of claim 23, wherein the phase shift is such that the polarity of the first magnetic field produced in the first conductive coil of the semiconductor chip opposes the polarity of the second magnetic field produced in the second conductive coil of the rewiring substrate.

25. The method of claim 22, wherein the first and second conductive coils are fabricated by photolithographic techniques.

* * * * *